United States Patent [19]
Datta et al.

[11] Patent Number: 5,190,463
[45] Date of Patent: Mar. 2, 1993

[54] HIGH PERFORMANCE METAL CONE CONTACT

[75] Inventors: Madhav Datta, Peekskill; David E. King, Endicott; Alan D. Knight, Newark Valley; Carlos J. Sambucetti, Croton-on-Hudson, all of N.Y.

[73] Assignee: International Business Machines Corporation, Armonk, N.Y.

[21] Appl. No.: 797,575

[22] Filed: Nov. 25, 1991

Related U.S. Application Data

[62] Division of Ser. No. 596,432, Oct. 12, 1990, Pat. No. 5,105,537.

[51] Int. Cl.$^5$ .............................................. H01R 9/09
[52] U.S. Cl. ............................................................ 439/74
[58] Field of Search ........................ 439/55, 67, 68, 74, 439/290, 291; 174/94 R, 94 S; 29/884

[56] References Cited

U.S. PATENT DOCUMENTS

| | | | |
|---|---|---|---|
| 3,344,316 | 9/1967 | Stelmak | 439/426 |
| 3,634,807 | 1/1972 | Grobe et al. | |
| 3,725,845 | 4/1973 | Moulin | |
| 3,853,382 | 12/1974 | Lazar | 174/94 R |
| 3,881,799 | 5/1975 | Elliott et al. | 174/94 R |
| 4,050,756 | 9/1977 | Moore | |
| 4,125,310 | 11/1978 | Reardon, II | 439/329 |
| 4,208,242 | 6/1980 | Zampiella | 156/659.1 |
| 4,240,198 | 12/1980 | Alonso | 29/876 |
| 4,253,908 | 3/1981 | Stephen-Daly | 156/659.1 X |
| 4,398,994 | 8/1983 | Beckett | 156/659.1 |
| 4,604,644 | 8/1986 | Beckham et al. | 29/840 |
| 4,644,130 | 2/1987 | Bachmann | 219/121 LJ |
| 4,746,399 | 5/1988 | Demmer et al. | 156/659.1 X |
| 4,751,563 | 6/1988 | Laibowitz et al. | 357/71 |
| 4,813,129 | 3/1989 | Karnezos | 29/832 |
| 4,940,510 | 7/1990 | Burt | 156/664 X |
| 4,976,626 | 12/1990 | Dibble et al. | 439/67 |
| 5,118,299 | 6/1992 | Burns et al. | 439/74 |

FOREIGN PATENT DOCUMENTS 52-73394 6/1977 Japan .................................. 439/290
1-301397 12/1989 Japan .................................. 156/659.1

OTHER PUBLICATIONS

Research Disclosure, No. 287, p. 28748; Mar. 1988, "Method to Provide Multiple Dendritic Contact Points for High Density Flat on Flat Connector System", disclosed anonymously.

Electrochimica Acta, vol. 25, pp. 1255-1262, 1980, "On the Role of Mass Transport in High Rate Dissolution of Iron and Nickel in ECM Electrolytes", Parts I and II, M. Datta et al.

Electrochimica Acta, vol. 29, pp. 1477-1486, 1984, "On the Theory of Anodic Levelling: Model Experiments with Triangular Nickel Profiles in Chloride Solution", C. Clerc et al.

(List continued on next page.)

Primary Examiner—Neil Abrams
Attorney, Agent, or Firm—Lawrence R. Fraley; Judith D. Olsen

[57] ABSTRACT

An electrical interconnection, which includes a method for fabricating the device, is disclosed. The interconnection comprises two contact surfaces, on at least one of which is disposed at least one solid metal conical projection in predetermined dimension and location. Rather than necessarily being permanently cojoined, the contact surfaces are attachable and detachable when desired. The conical projections on one contact surface make ohmic contact, either by wiping with an intermeshing like structure on a second contact surface or by contacting a second contact surface which is a substantially flat contact pad. An interconnection, in this invention, is the combination of at least one contact having individual conical projections and another contact, optionally having individual conical projections. The conical projections are formed in metal by electrochemical machining in neutral salt solution, optionally in a continuous foil. The conical projections are also optionally formed on the head of a contact pin.

9 Claims, 4 Drawing Sheets

OTHER PUBLICATIONS

Journal of Electrochemical Society, vol. 136, No. 6, pp. 285C-292C, Jun. 1989, "Application of Chemical and Electrochemical Micromachining in the Electronics Industry", M. Datta et al.

Journal of the Electrochemical Society, vol. 136, No. 8, pp. 2251-2256, Aug. 1989, "Jet and Laser-Jet Electrochemical Micromachining of Nickel and Steel", M. Datta et al.

Journal of Applied Electrochemistry, vol. 20, pp. 69-76, 1990, "Electrochemical Dissolution of Stainless Steels in Flow Channel Cells With and Without Photoresist Masks", E. Rosset et al.

Technical Disclosure Bulletin, vol. 22, No. 7, p. 2706, Dec. 1979, "Liquid Metal/Dendrite Connector", R. Babuka et al.

Technical Disclosure Bulletin, vol. 24, No. 1A, p. 2, Jun. 1981, "Process for Producing Palladium Structures", E. J. Armstrong et al.

Technical Disclosure Bulletin, vol. 23, No. 8, p. 3631, Jan. 1981, "Dendrite Connector System With Reinforced Base", E. J. Armstrong.

HIGH PERFORMANCE METAL CONE CONTACT

This application is a divisional application of Ser. No. 596,432, filed Oct. 12, 1990, and now U.S. Pat. No. 5,105,537.

BACKGROUND OF THE INVENTION

1. Field of the Invention

The present invention relates to an electrical interconnection and means of making the interconnections, which are useful in electronic packaging applications such as in semiconductor integrated circuit chips and circuit boards and cards, cables and modules.

Recent developments in integrated circuits have clearly demonstrated the benefits which can be achieved by fabricating electrical devices into smaller and smaller packages. These small packages are densely packed, being multilevel with signal and power planes and other features on various levels and means of interconnecting selected levels to one another. The interconnections themselves provide sites for potential signal degradation. For example, interconnections between levels of conductor lines, and between conductor lines of a printed circuit board (PCB) or card and any electrical devices mounted thereon can be made between conductive areas called pads. Impedance matching, minimum number of discontinuities and redundancy must be present at these interconnections in order to permit rapid, low noise, low loss, low resistance signal transmission. Approaches used at present in devising interconnections for these electronic packages may require numerous processing steps, and the attachment of surface mounted devices may require soldering and rework, often involving exposing the components to destructive temperature cycling.

Copending application Ser. No. 07/520,335, filed May 7, 1990 to Burns et al., now U.S. Pat. No. 5,118,299 and commonly assigned with the present invention describes a single and a double sided contact comprised of polymeric cones which have been formed in polymer sheets by excimer laser and have been surface metalized. The cone connectors of the present invention, like that in the copending application, provide the low cost, high frequency, redundant, fine tipped high performance pad-on-pad contacts required. However, the cones of the present invention, being differently comprised and differently fabricated, provide an alternative to those of the copending application.

2. Description of the Art

Electrical interconnections comprised of interdigitated dendritic projections are a fertile field of scientific inquiry. The conical projections of the present invention are distinguished from dendritic projections by the method of making, by composition, and by the controlled location and dimensions of conical projections. Schemes proposed to strengthen dendrites, such as coating with soft metal are described in IBM Technical Disclosure Bulletin, Vol. 22, No. 7, p. 2706 by Babuka et al and copending application Ser. No. 07/415,435 to Cuomo et al, filed Sep. 28, 1989 and commonly assigned with the present invention.

IBM Technical Disclosure Bulletin Vol. 22, No. 7, p. 2706, published December, 1979 by Babuka et al. describes a high density pad-to-pad connector on which dendrites are grown on a pad and coated with a liquid gallium alloy. When the dendritic pad is mated, the dendrites pierce the tarnished liquid metal film of a second pad and make the electrical contact.

IBM Technical Disclosure Bulletin, Vol. 24, No. 1A, June, 1981, p. 2, "Process For Producing Palladium Structures" by Armstrong et al describes that the small cross-section of the base of the dendrite is at least partly responsible for breakage of dendrites. It also describes the need for "wipe" to make low resistance contact, but states that the roughness of the dendritic surfaces provides sufficient wipe.

IBM Technical Disclosure Bulletin, Vol. 23, No. 8, January, 1981, p. 1, "Dendrite Connector System With Reinforced Base" by Armstrong agrees with the above diagnosis, but differs in the proposed cure, proposing instead reflowing tin around the bases of the dendrites. Dendrites as pad-to-pad contact elements are also described in *Research Disclosure*, March, 1988, No. 287, p. 28748, "Method to Provide Multiple Dendritic Contact Points for High Density Flat on Flat Connector System", disclosed anonymously. Again, the dendrites, described are irregularly shaped and randomly located. However, the reduced connector length of the dendrites are described as providing noise reduction and improved signal speed, and the references suggests that having multiple contact points lowers contact resistance.

The cones of the present invention, unlike the dendrites of several of the above references, do not require reinforcement.

Other means in the art of making electrical interconnection between contact pads include spheres (U.S. Pat. No. 3,634,807 issued Jan. 11, 1972 to Grobe et al, U.S. Pat. No. 4,604,644 issued Aug. 5, 1986 to Beckham et al) conductive rods (U.S. Pat. No. 4,644,130 issued Feb. 17, 1987 to Bachmann, U.S. Pat. No. 4,050,756 issued Sep. 27, 1977 to Moore, and U.S. Pat. No. 4,240,198, issued Dec. 23, 1980 to Alonso), hollow posts (U.S. Pat. No. 3,725,845) and third structures interposed between and parallel to the connector pads but separate from both (U.S. Pat. Nos. 3,881,799, issued May 6, 1975 to Elliott et al and 3,634,807, issued Jan. 11, 1972 to Grobe et al).

Flat-topped protrusions, permanently connecting pads between levels in a multilayer structure are described in the art (U.S. Pat. No. 4,751,563, issued Jun. 14, 1988 to Laibowitz et al).

U.S. Pat. No. 3,634,807, issued Jan. 11, 1972 to Grobe et al. describes a removably attachable contact comprising a plurality of hollow metal spheres or wire balls mounted in a predetermined pattern on either side of a flexible insulating sheet. Alternatively, metal is deposited in openings at the intersection of thin strips of insulating material. In another embodiment, a conductive sheet is sandwiched between sets of contact elements. These embodiments are designed to be relatively inflexible in the X-Y direction and flexible in the Z direction.

U.S. Pat. No. 3,725,845 issued Apr. 3, 1975 to Moulin describes a hermaphroditic connector comprising a plurality of hollow posts. It is a large scale connector for watertight use with cables in geophysical surveying, rather than for use with microminiature contact pads in packaging.

U.S. Pat. No. 3,881,799 issued May 6, 1975 to Elliott et al. describes a connector that comprises a plurality of domes projecting from both sides of a spring matrix, interposing a third element between the contacts to be connected, the third element being integral to neither.

All the above nondendritic contact means are inadequate for use in high packing density structures, being of dimensions which are too large and too vulnerable to dirt contamination.

U.S. Pat. No. 4,644,130 issued Feb. 17, 1987 to Bachmann describes a plurality of elastomeric connector rods which have been rendered conductive by being filled with conductive particles dispersed therein.

U.S. Pat. No. 4,751,563 issued Jun. 14, 1988 to Laibowitz et al. describes a method of making a cone shaped structure, having a carbonaceous surface contaminant, using an electron beam. A conductive layer is deposited on at least a portion of the cone and over the substrate area around the base of the cone. Then an insulating material is applied overall and any further processing is performed. Structures described in this patent are in the nature of through-holes, buried irreversibly within a unitary multilayer structure rather than being removably attached. Since electron beam radiation is used, the material from which the cone is comprised must of course be removable by electron beams.

Unlike connectors described in the art, the electrochemically machined (ECM) connector of the present invention is simply fabricated, reproducible, completely metallic, substantially smooth, of a single preselected height, non-brittle and applicable to interconnection of high density circuitry. Furthermore, the neutral salt electrolyte solutions in which the cones of the present invention are prepared pose no known safety problem, even when recirculated as in the present invention.

A number of fundamental studies of electrochemical machining have been reported in journal literature. The importance of mass transport conditions for high rate dissolution of iron and nickel in 5M NaCl, 5M NaClO3 and 6M NaNO3 was discussed in "On the Role of Mass Transport in High Rate Dissolution of Iron and Nickel in ECM Electrolytes" Parts I and II, by Datta et al. in Electrochimica Acta, Vol. 25, pages 1255-1263, 1980. Anodic levelling of nickel peaks in NaCl solution was discussed in "On the Theory of Anodic Levelling: Model Experiments with Triangular Nickel Profiles in Chloride Solution" by Clerc et al. in Electrochimica Acta, Vol. 29, pages 1477-1486, 1984. More recently, micromachining of small dimensions ranging from several microns to millimeters has been discussed for various metal and semiconductor-electrolyte systems in "Application of Chemical and Electrochemical Micromachining in the Electronics Industry", by Datta et al. in Journal of the Electrochemical Society, Vol. 136, No. 6, pages 285C-292C, June, 1989. Drilling of holes and slots in nickel and steel in neutral salt solutions is discussed in "Jet and Laser-Jet Electrochemical Machining of Nickel and Steel" by Datta et al. in Journal of the Electrochemical Society, Vol. 138, No. 8, pages 2251-2256, Aug. 1989. The feasibility of etching grooves in stainless steel in neutral salt solutions through photoresist masks, and problems inherent in the process were discussed in "Electrochemical Dissolution of Stainless Steels in Flow Channel Cells With and Without Photoresist Masks" by Rosset et al., Journal of Applied Electrochemistry, Vol. 20, pages 69-76, 1990.

These articles in general report on fundamental studies of electrochemical machining which have been performed under controlled hydrodynamic conditions in order to acquire an understanding of the anodic behavior of the metal-electrolyte system. Electrochemical machining involves a high rate of metal removal from a workpiece that has been made anodic in an electrolytic cell. In neutral salt solution, hydrogen evolution takes place at the cathode. The process of metal removal from the anode, being electrochemical in nature, is independent of the hardness of the metal to be removed. Unlike mechanical machining, the ECM process does not introduce stresses into the machined workpiece.

Based on electrochemical studies, ECM systems are divided into two types: passivating and non-passivating. Passivating electrolytes contain oxidizing anions, such as nitrate anions, resulting in the formation of an oxide film on the anode material and possible oxygen evolution rather than metal dissolution at the anode at low current densities. At high current densities, however, a high rate of metal dissolution is possible in oxidizing systems. In non-passivating electrolytes, because of the presence of aggressive anions, oxide films do not form and oxygen evolution is not possible. Metal dissolution is the only anodic reaction in the non-passivating electrolyte. In conventional ECM, in which photolithographic masking is not used, the passivating electrolytes are generally preferred because of their inert nature and their ability to evolve oxygen at low current densities, thereby minimizing stray cutting effects. However, for the present invention, in which masking is employed, oxygen evolution may cause lifting or may otherwise damage the mask.

In both passivating and non-passivating systems, the rate of metal dissolution is dependent on the current density (or on the applied voltage), electrolyte concentration, and to an extent on the hydrodynamic conditions.

None of the journal articles summarized above describes the fine tipped pad-to-pad cone connectors of the present invention nor the manner of making.

Thus, it is one object of the present invention to use an electrochemical machining technique in a simple salt solution to provide high performance solid metal cone connectors.

It is a further object of the invention to provide the capability to interconnect high density packages of electrically mounted devices and PCBs and/or cards to each other and to cables.

It is a further object of the invention to provide an electrical interconnection which permits reliable, rapid, dirt tolerant, low noise, low loss, low resistance signal transmission.

It is a further object of the invention to provide a method of making the electrical interconnection described above in an efficient and controllable manner.

It is a further object of this invention to provide a conical electrical interconnection useful in the art of electronic packaging.

It is a further object of the invention to provide a low resistance electrical interconnection nondestructively connectable and disconnectable. consisting of solid metal cones.

Still another object of the invention is to provide a fabrication method to produce an electrical interconnection between two contact surfaces, at least one of which comprises essentially perpendicular conical projections of predetermined pattern and dimensions.

These and other objects, features and advantages of the present invention will become more apparent from the descriptions to follow.

SUMMARY OF THE INVENTION

The electrical interconnection of the present invention comprises a first and a second contact surface, at least one of which includes a conductive substrate (9) having conical protrusions (10) extending substantially perpendicularly therefrom. The conical conductors comprise a plurality of solid metal cones suitable for high performance electrical contact, as described more fully hereinbelow.

The metal cones are formed by high speed electrochemical machining of a metal foil, sheet, pin head or the like through a mask. The process comprises high speed electrochemical etching in an aqueous salt solution by selective anodic dissolution of areas defined on the metal by a mask. The process is applicable to a wide variey of metals and alloys including, but not limited to, copper, gold, chromium, tin, lead, nickel, aluminum, titanium, rhodium, palladium and steel, and is independent of the hardness of the etched material.

As in the aforementioned copending application, the present invention includes a single and a double sided embodiment.

A stream of aqueous salt solution is directed at the metal surface, which is anodically charged. Metal is removed from areas not blocked by the mask. The arrangement of photoresist dots on the mask predetermines the location of the conical projections to be formed. A second conductive surface is optionally also provided with conical projections designed to wipe and intermesh with those on the first conductive surface and prepared in the same manner. The conductive cones extending substantially perpendicularly from their respective conductive substrate, contacted together, form the interconnection, which provides contact while being freely attachable and detachable as desired, for example, for testing. Alternatively, they can be permanently cojoined by soldering or the like.

In the double-sided embodiment, wherein conical projections disposed on a first conductive substrate are brought into interdigitated contact with like conical projections similarly disposed on a second conductive substrate, the respective spacing of the conical projections is such that there is mutual "wipe" between contacting conical projections without their breakage, while at the same time surface contaminants are displaced from the conical projections.

Contact is further facilitated by the shaping of the top of each of the conical projections, which are sharply domed, and by the fact that in operation a typical conical projection is in contact with four nearest neighbor cones.

In the single-sided embodiment, conductive conical projections, disposed on only a first conductive surface, are brought into contact with a second, planar, conductive surface, forming the electrical interconnection. The tips of the conical projections are brought into contact with enough force to displace any contaminants which may be present on the second conductive surface.

Alternatively, in a pin-type conical interconnection, a second conductive surface may, instead of contact pads alone, include conductive through-holes or blind vias, within which contact is made by a connector pin. The pin is optionally soldered in place. Then the conical projections, which are disposed on the head of the pin, are brought into contact with a first conductive surface.

The conical projections are essentially perpendicular in relation to their respective conductive surface. The height of the cones is selected in part to be sufficient for any contaminant or dust to reside therebetween when displaced such that the resistance of the interconnection to be formed is not elevated thereby. Normally in the present invention cones of about 60 to about 80 microns high were prepared and found to be of adequate height.

DESCRIPTION OF THE DRAWINGS

FIG. 3, a b and c show scanning electron micrographs (SEMs) of the fabrication by electrochemical machining through a mask of metal cones comprised of (a) hardened stainless steel, and (b, c) copper.

DESCRIPTION OF THE PREFERRED EMBODIMENTS

Figure 1:
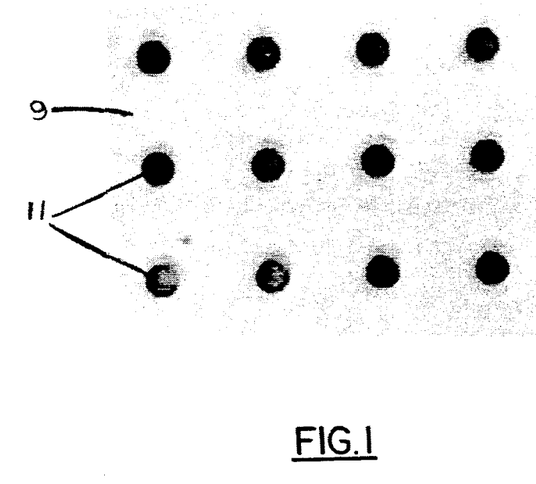
FIG. 1 is an optical photograph of an unetched metal substrate (9) masked with an array of photoresist dots (11).
Figure 2:
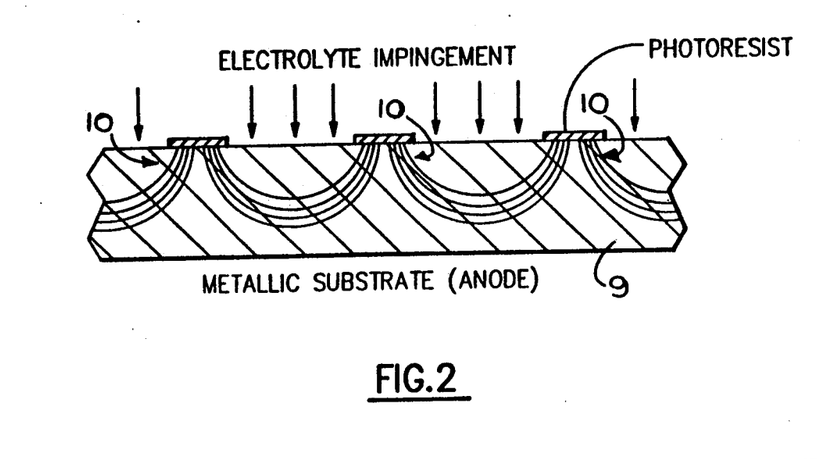
FIG. 2 is a schematic representation of the formation of cones (10) during the electrochemical machining process through a mask.
Figure 5A:
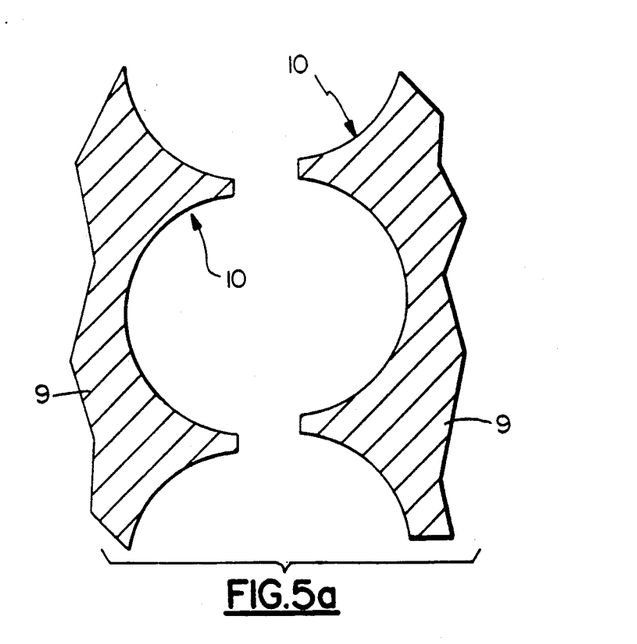
FIGS. 5a and 5b illustrate an electrical connection assembly comprised of two of the structures as shown in FIG. 2, prior to and during connection therebetween.
Figure 5B:
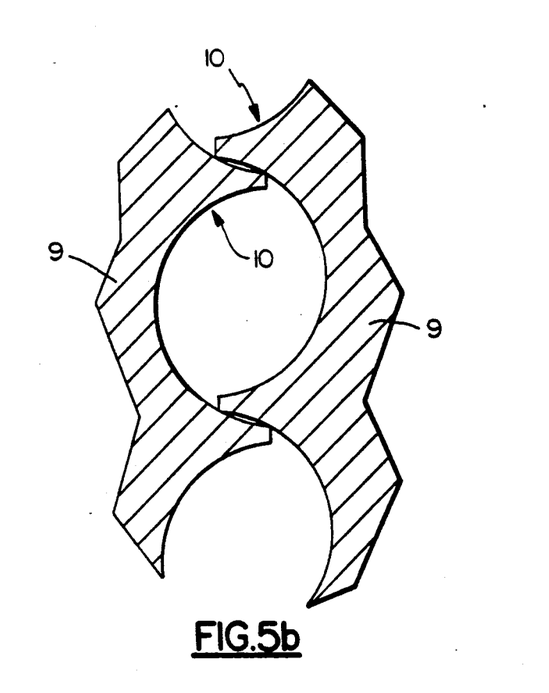

The array of conical projections comprises metal conical protrusions formed by electrochemical machining in a neutral salt solution through a polymer mask. The process involves the principles of high speed dissolution of metals. In order to fabricate cones on metal films, foils, sheets or pin heads, through-mask machining concepts are employed. Photoresist is applied to the metal material. Photoprocessing leaves evenly spaced dots 11 suitably arrayed for the pad-on-pad connector (FIG. 1). It will be obvious to one skilled in the art that alternate means other than photoprocessing may be used to create the dots, such as silk-screening. The metal substrate masked with photoresist is made anodic in an electrolytic cell, where it directly and closely faces a cathode. An electrolyte flows through the spacing between the cathode and the anode. Upon passage of the current, the anode material dissolves in the areas which remain unprotected by the photoresist. As anodic dissolution continues, the removal of material between the dots leads to formation of cavities which, under certain conditions, grow preferentially in the vertical direction, seen in FIG. 2, finally leading to the formation of the cones 10 seen in FIG. 2. As shown in FIG. 2, each cone 10 is interconnected to the next adjacent cone by rounded surfaces as a result of the formation process of the invention. This also results in a final structure of monolithic construction; that is, the structure of FIG. 2 is formed or composed of material without seams or joints, thereby constituting an undifferentiated whole. The structure in FIG. 2 is for illustration purposes only, of course as in a preferred (or typical) embodiment, the resulting cones would be more closely spaced, as mentioned above. It is understood, however, that even in the more widely spaced pattern in FIG. 2, effective wiping does occur between the respective pair of cones which engage one another (FIG. 5b).

Preferential dissolution in the desired direction is a key to the success of the process. Preferential dissolution in the desired direction is achieved by employing an impinging multi-nozzle flow or, alternatively, by employing a channel flow apparatus so that extremely high electrolyte flow rate can be provided. If the system is run with a slow, i.e. laminar, flow, cone formation and preferential etching will not occur. In addition to the electrolytic flow cell and means for providing extremely high flow rate, the apparatus used also comprises a small centrifugal pump, and a filtering unit to filter out the hydroxide precipitates that are formed in the solution as the machining proceeds.

Using neutral salt solutions comprising sodium nitrate or, alternatively, sodium chloride, cones can be fabricated in both copper and in hardened stainless steel by through-mask electrochemical machining at extremely high speed. In order to obtain best results it is necessary to choose a metal-electrolyte combination and operating parameters which yield high current efficiency for metal dissolution, because the anodic evolution of oxygen leads to premature detachment of the photoresist dots and consequent unsatisfactory cone formation.

Figure 3A:
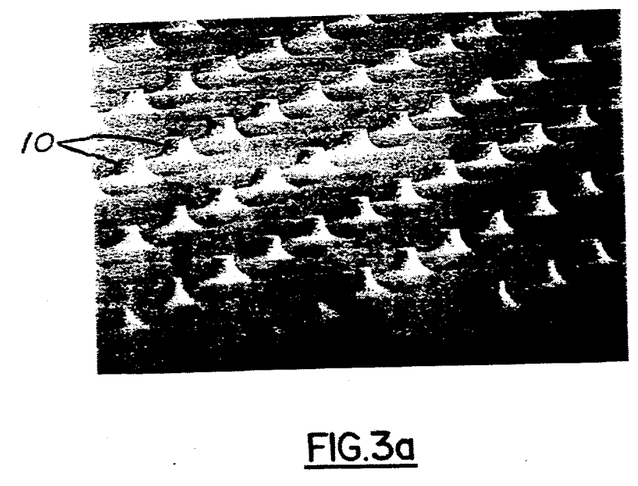
Figure 3B:
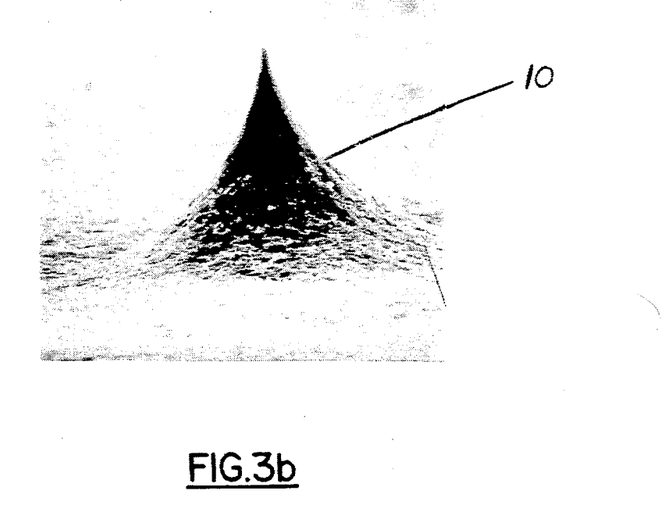
Figure 3C:
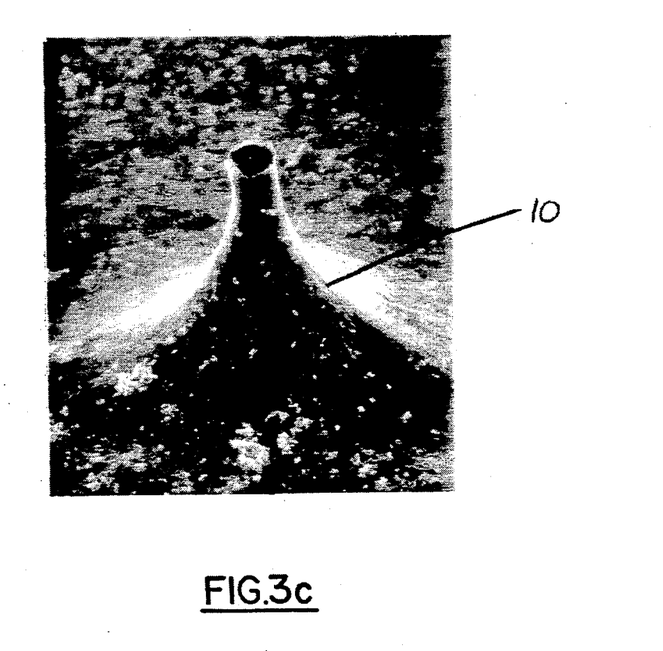

FIGS. 3a-3c show SEMs of some of the cones fabricated on copper film and on stainless steel. It will be clear to one skilled in the art that a judicious selection of electrolyte and machining conditions will permit fabrication of cones from other metals and alloys as well.

Figure 4:
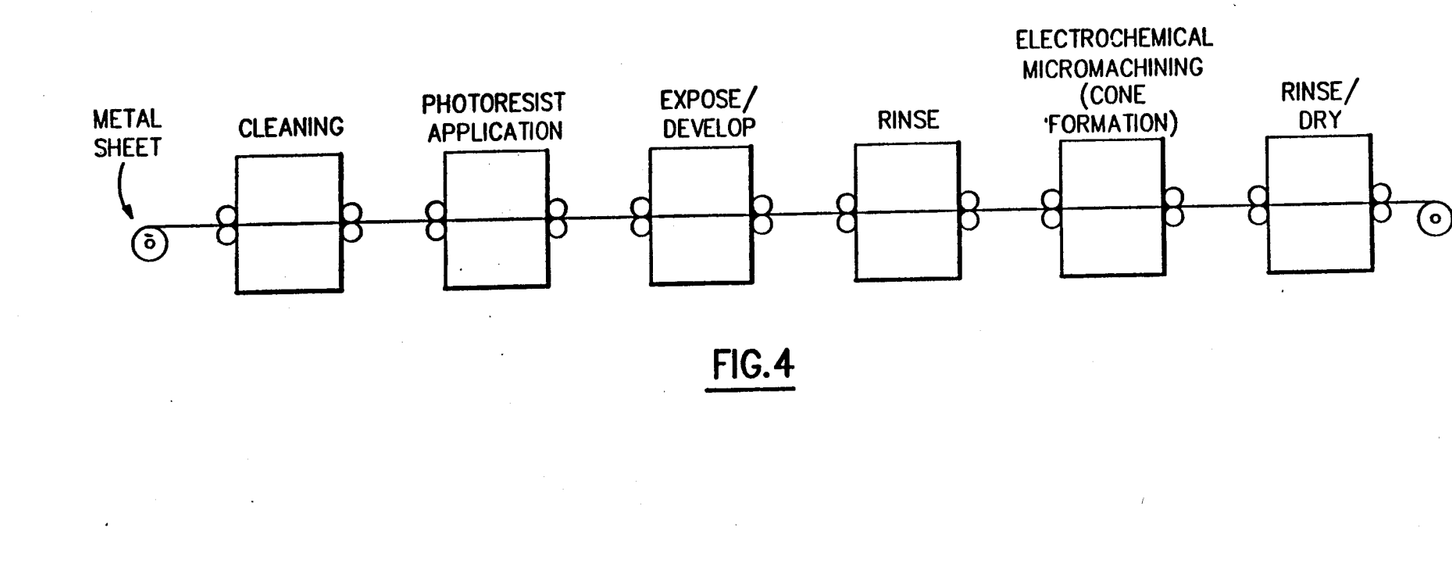
FIG. 4 is a schematic representation of the steps involved in a roll to roll process of making metal cones.

FIG. 4 describes in a flow chart a continuous system for large scale reel-to-reel cone formation in a manufacturing environment.

The process described can be used in a continuous flow manufacturing operation, wherein the metal anode overlaid with the photoresist pattern passes at high speed through a set of equally spaced, multi-nozzled cathodes through which an electrolyte flows. In order to obtain uniformly distributed, needle-like cones, current distribution problems at the anode can be solved by the addition of dummy photoresist lines surrounding the area where cones are to be formed, a technique known in the electrochemical art.

For some applications, an optional additional step of overcoating the finished cones with noble metals, such as by electroplating or by electroless plating about 50 to about 100 microinches of hard gold on stainless steel cones, may be desired in order to maintain low contact resistance. If the cones were comprised of copper, the fact of gold and copper interdiffusion would suggest a diffusion barrier of about 50 to about 100 microinches of nickel between the copper cones and the gold overcoat.

Metal discs fabricated by this method can be reflow soldered onto circuit pads on flexible circuits, circuit boards or cards with cone side up for making pad-to-pad contact.

It should also be noted in general that the narrower the tips of the cones, the better the contact that can be made. However, the broader the base, the more resistant are the cones expected to be to lateral forces.

EXAMPLE 1

An ECM electrolyte consisting of 3 Molar NaCl was prepared to be used at ambient temperature. The anode material was hardened, Number 420 (Fe13%Cr) stainless steel sheet, ⅛ inch thick. The stainless steel anode was cleaned by conventional degreasing methods using isopropyl alcohol. Dynachem UF photoresist was applied in the manner recommended by the manufacturer and a pattern of photoresist dots was developed on the anode surface. Any liquid or dry photoresist that can withstand a pH environment of about 3 to about 8 can be used. The samples, with photoresist masks, were mounted on an anode holder and placed in an electrolytic cell where a shower of electrolyte was directed to the sample anode. Any typical electrolytic cell can be used or adapted. The cathode assembly consisted of a perforated stainless steel plate acting as the shower head which was mounted on a Plexiglas (trademark of Rohm and Haas Co.) enclosure. The electrolyte from a reservoir was pumped through the cathode assembly. The rate of the electrolyte flow was 3 gallons per minute (gpm). The spacing between the cathode plate and the anode was 3 mm. This arrangement provided extremely high electrolyte impingement at the sample anode, thus leading to preferential metal removal from the direction that is required to obtain cones. A potential of 5 volts was applied across the cell. Under these conditions oxygen evolution did not occur and very high rate of material removal was obtained. The amount of electrical charge necessary to obtain a desired cone shape was measured by a coulometer. The coulometer was also used as a means of determining the end point of the ECM operation.

As shown in FIG. 2, formation of cones 10 with sharp needles required removal of material to be continued until the photoresist undercutting was nearly half the diameter of the photoresist dots. The amount of electrical charge necessary to obtain a desired cone shape is dependent on the dot size and the undercutting, which in turn is dependent on the metal removal rate and the impingement rate of the electrolyte. Optimum conditions leading to desired cone shapes can, in principle, be obtained by mathematical modeling of the system. We have determined experimentally the amount of charge necessary to determine the needle shapes for the above parameters. We found that for a dot size of 4 mils (100 microns), a material removal of about 60 microns thick was required. The amount of charge required is related to the thickness removed by Faraday's Law which can be written as:

$$\text{Delta } 1 = QM/nF\rho$$

where Delta 1 is the thickness of the material removed, Q is the quantity of charge, M is the molecular weight, n is number of electrons transferred (=3.4 for FE13%Cr stainless steel), the F is Faraday's constant and rho is the density of the material. The amount of charge was monitored in a coulometer. By varying the amount of charge, cones of different heights can be obtained.

EXAMPLE 2

The details of the procedure used were substantially similar to that described in Example 1, except that the anode material consisted of copper plates. The cleaning procedure consisted of dipping in dilute sulfuric acid and rinsing before photoresist application. The applied voltage was 3, and in the above mentioned Faraday equation n=2.

EXAMPLE 3

The electrochemical micromachining method of making metallic cone connectors can be easily adapted to continuous flow manufacturing on a roll to roll process. The process steps that would be involved are indicated in the schematic shown in FIG. 4.

It will be understood that the present invention may be embodied in other specific forms and processes without departing from the spirit or essence therefore. The present examples and embodiments are to be considered as illustrative rather than restrictive, and the invention unlimited to the details recited herein.

We claim:

1. An electrical connection assembly for use in high density circuitry applications, said electrical connection assembly comprising first and second electrical connection structures adapted for engaging each other in an interdigitated, freely detachable and wiping manner to provide electrical connection therebetween, each of said electrical connection structures being of electrochemically machined, monolithic construction of a singular conductive metallic material and including a solid substrate portion having a plurality of solid cones projecting substantially perpendicularly from said substrate, each of said solid cones being of sharply domed configuration having rounded side walls the interconnecting surfaces between adjacent ones of said solid cones on each of said electrical connection structures being substantially rounded, said solid cones of said first electrical connection structure intermeshing with said solid cones of said second electrical structure to form said freely detachable and wiping connection during said engagement between said first and second electrical connection structures.

2. The assembly of claim 1 wherein said conductive metallic material is selected from the group consisting essentially of copper, gold, chromium, tin, lead, nickel, aluminum, titanium, rhodium, palladium and steel.

3. The assembly of claim 1 wherein said solid domes possess a height of about 60 to about 80 microns.

4. The assembly of claim 1 wherein said solid cones includes an overcoat of noble metal material thereon.

5. The assembly of claim 4 wherein said noble metal material is gold.

6. The assembly of claim 5 wherein said noble metal overcoat possesses a thickness of about 50 to about 100 microinches.

7. The assembly of claim 4 further including a diffusion barrier between said solid cones and said overcoat of noble metal material.

8. The assembly of claim 7 wherein said conductive metallic material of said solid cones is comprises of copper, said noble metal material is comprised of gold, and said diffusion barrier is comprised of nickel.

9. The assembly of claim 7 wherein said diffusion barrier possesses a thickness of about 50 to about 100 microinches.

* * * * *